(12) United States Patent
Hanaoka

(10) Patent No.: US 11,821,934 B2
(45) Date of Patent: Nov. 21, 2023

(54) POWER SUPPLY CONTROL APPARATUS AND SEMICONDUCTOR FAILURE DETECTION METHOD

(71) Applicant: Yazaki Corporation, Tokyo (JP)

(72) Inventor: Hiromichi Hanaoka, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/838,811

(22) Filed: Jun. 13, 2022

(65) Prior Publication Data

US 2023/0009865 A1 Jan. 12, 2023

(30) Foreign Application Priority Data

Jul. 7, 2021 (JP) ................................. 2021-112930

(51) Int. Cl.
    *G01R 31/26* (2020.01)

(52) U.S. Cl.
    CPC ................ *G01R 31/2621* (2013.01)

(58) Field of Classification Search
    CPC ...... H03K 17/18; H03K 17/122; G01R 31/40; G01R 31/3277; G01R 31/2621
    See application file for complete search history.

(56) References Cited

U.S. PATENT DOCUMENTS

| | | | | |
|---|---|---|---|---|
| 5,895,989 A | * | 4/1999 | Imaizumi | G01R 31/007 361/88 |
| 2010/0225292 A1 | * | 9/2010 | Nishimori | H02M 3/156 323/288 |
| 2011/0068818 A1 | | 3/2011 | Fukami | |
| 2020/0169077 A1 | | 5/2020 | Egelhof et al. | |
| 2021/0041502 A1 | * | 2/2021 | Song | G01R 31/327 |
| 2022/0229104 A1 | * | 7/2022 | Jo | G01R 31/27 |

FOREIGN PATENT DOCUMENTS

| | | |
|---|---|---|
| DE | 102018212351 A1 | 1/2020 |
| EP | 3282533 A1 | 2/2018 |
| EP | 3754347 A1 | 12/2020 |
| JP | 201171174 A | 4/2011 |
| JP | 2019135819 A | 8/2019 |
| WO | 2021101322 A1 | 5/2021 |

\* cited by examiner

*Primary Examiner* — Son T Le
*Assistant Examiner* — Adam S Clarke
(74) *Attorney, Agent, or Firm* — Sughrue Mion, PLLC

(57) ABSTRACT

A power supply control apparatus detects a failure of a semiconductor switch element in a switching circuit having semiconductor series circuits each having semiconductor switch elements connected in series with reverse polarities. The power supply control apparatus includes a reference resistance value storing unit storing information on a combined resistance value between an input and an output of the switching circuit, a conduction current detection unit configured to detect a current flowing through the switching circuit, a potential difference detection unit configured to detect an input-output potential difference between the input and the output of the switching circuit, a voltage drop calculation unit configured to calculate an assumed voltage drop, a voltage comparison unit configured to compare the input-output potential difference with the assumed voltage drop, and a failure identification unit configured to identify a failure of the semiconductor switch element.

10 Claims, 3 Drawing Sheets

POWER SUPPLY CONTROL APPARATUS AND SEMICONDUCTOR FAILURE DETECTION METHOD

CROSS-REFERENCE TO RELATED APPLICATIONS

This application is based on and claims priority under 35 USC 119 from Japanese Patent Application No. 2021-112930 filed on Jul. 7, 2021, the contents of which are incorporated herein by reference.

TECHNICAL FIELD

The present disclosure relates to a power supply control apparatus and a semiconductor failure detection method.

BACKGROUND ART

For example, when electric power is supplied from a power supply to a load such as an electric motor, it is general to switch on and off an operation of the load or to connect a semiconductor switch element capable of performing ON/OFF control between the power supply and the load in order to adjust an operation amount of the load, in many cases, a power MOSFET is used as the semiconductor switch element.

In various devices employing the semiconductor switch element, there is a possibility that an operation failure occurs due to a failure of the semiconductor switch element. Therefore, a technique for detecting a failure of the semiconductor switch element is required.

In addition, JP-A-2011-71174 discloses a technique for detecting characteristic deterioration that leads to a failure of a semiconductor device. In JP-A-2011-71174, a semiconductor device (IPD) 1 includes a set value storage unit 3 that stores a set value based on an initial characteristic value of the IPD 1, and a detection circuit 4 that detects characteristic deterioration of the IPD 1 based on a characteristic value of the IPD 1 at a predetermined liming and the set value stored in the set value storage unit 3. In a characteristic deterioration detection method of JP-A-2011-71174, the set value determined based on the initial characteristic value is stored, and the characteristic deterioration of the IPD 1 is detected based on the characteristic value of the IPD 1 at the predetermined liming and the stored set value.

Further, JP-A-2019-135819 discloses a power semiconductor module capable of reducing the number of components of a semiconductor element while improving power supply redundancy of a system, and a vehicle power supply system including the power semiconductor module.

However, the technique disclosed in JP-A-2011-71174 is intended to detect a failure occurring in a semiconductor included in an internal circuit of a single semiconductor device (IPD: Intelligent Power Device), and cannot be used in a case of detecting a failure of a circuit in which a plurality of semiconductor switch elements are combined.

For example, in a case of an electronic device mounted on a vehicle, there is a possibility that a wiring or an in-vehicle battery is erroneously connected in a state in which a polarity of a power supply supplied from a vehicle side is reversed, in addition, for example, there is a possibility that a power supply having a high voltage of 24 [V] or the like is erroneously connected to an electronic device to which a power supply voltage of 12 [V] is to be supplied.

In order to avoid an occurrence of a failure in the case of the erroneous connection as described above, the electronic device mounted on the vehicle is often equipped with a function of protecting the circuit. As a specific example, a diode is connected in series with the semiconductor switch element in order to prevent an abnormal current from flowing due to application of the voltage with the reversed polarity, in addition, such a diode has a relatively large electric power loss, and a space required for disposing the diode is also relatively large. Therefore, instead of the diode, another semiconductor element equivalent to the semiconductor switch element may be connected in series with a reversed polarity.

In addition, in a circuit that requires switching of a very large current, there is a possibility that sufficient current switching capability cannot be obtained or sufficient reliability cannot be secured by using only one semiconductor switch element.

Therefore, for example, as in the system shown in FIG. 1 and the like of JP-A-2019-135819, there is a case in which a plurality of semiconductor switch elements are connected in series with reversed polarities, and the plurality of semiconductor switch elements are further connected in parallel.

However, when the plurality of semiconductor switch elements are connected in series with reversed polarities and the plurality of semiconductor switch elements are connected in parallel as described above, it is difficult to detect a failure when the failure occurs in any one of the semiconductor switch elements.

For example, when power-supply electric power is supplied to a load side via the plurality of semiconductor switch elements connected in parallel, even if any one of the semiconductor switch elements fails and is fixed in a non-conductive (OFF) stale, a current flows to the load side via the remaining semiconductor switch elements, and thus the failure of the semiconductor switch element cannot be identified only by detecting a presence or absence of the current flowing to the load and high/low of an output voltage.

In addition, in a circuit in which the plurality of semiconductor switch elements are connected in parallel, when any one of the semiconductor switch elements fails in an OFF state, an abnormally large current intensively flows to the remaining normal semiconductor switch elements due to an influence of the failed one semiconductor switch element, and there is a high possibility that the normal semiconductor switch elements also fail due to an excessive stress caused b the current and heat. Therefore, when the device, in a state in which one semiconductor switch element fails in the circuit in which the plurality of semiconductor switch elements are connected, is left as it is, there is a high possibility that a function of the entire device is stopped.

For example, in a case of an electronic device mounted on an automobile or the like equipped with an autonomous driving function, since very high reliability is required, it is necessary to form the electronic device such that a situation in which respective functions of the electronic device are completely stopped does not occur.

SUMMARY OF INVENTION

The present disclosure has been made in view of the above circumstances, and an object of the present disclosure is to provide a power supply control apparatus and a semiconductor failure detection method capable of correctly identifying a presence or absence of a failure even in a state in which only a part of semiconductor switch elements fails in a circuit in which a plurality of semiconductor switch elements are connected in series and in parallel.

In order to achieve the above object, a power supply control apparatus according to the present disclosure is characterized as follows. An aspect of non-limiting embodiments of the present disclosure relates to provide a power supply control apparatus for detecting a failure of a semiconductor switch element in a switching circuit, the switching circuit including a plurality of semiconductor series circuits which are connected in parallel to one another, and each of the semiconductor series circuits having a plurality of semiconductor switch elements which are connected in series with reverse polarities, the power supply control apparatus including: a reference resistance value storing unit that stores in advance information on a combined resistance value between an input and an output of the switching circuit in a reference state as a reference resistance value; a conduction current detection unit that detects a magnitude of a current flowing through entire of the switching circuit as a conduction current; a potential difference detection unit that detects a potential difference between the input and the output of the switching circuit as an input-output potential difference; a voltage drop calculation unit that calculates an assumed voltage drop based on the reference resistance value and the conduction current detected by the conduction current detection unit; a voltage comparison unit that compares the input-output potential difference detected by the potential difference detection unit with the assumed volume drop calculated by the voltage drop calculation unit; and a failure identification unit that identifies a presence or absence of a failure of the semiconductor switch element based on a comparison result of the voltage comparison unit.

In order to achieve the above object, a semiconductor failure detection method according to the present disclosure is characterized as follows. An aspect of non-limiting embodiments of the present disclosure relates to provide a semiconductor failure detection method for detecting a failure of a semiconductor switch element in a switching circuit, the switching circuit including a plurality of semiconductor series circuits which are connected in parallel to one another, and each of the semiconductor series circuits having a plurality of semiconductor switch elements which are, connected in series with reverse polarities, the semiconductor failure detection method including; obtaining in advance a combined resistance value between an input and an output of the switching circuit in a reference state as a reference resistance value; detecting a magnitude of a current flowing through entire of the switching circuit as a conduction current; detecting a potential difference between the input and the output of the switching circuit as an input-output potential difference; calculating an assumed voltage drop based on the reference resistance value and the detected conduction current; and identifying a presence or absence of a failure of the semiconductor switch element based on a comparison result between the detected input-output potential difference and the assumed voltage drop.

According to the power supply control apparatus and the semiconductor failure detection method of the present disclosure, in a circuit in which a plurality of semiconductor switch elements are connected in series and in parallel, it is possible to correctly identify a presence or absence of a failure even in a state in which only a part of the semiconductor switch elements fails.

The present disclosure has been briefly described above. Details of the present disclosure will be further clarified by reading an aspect for implementing the disclosure to be described below with reference to the accompanying drawings.

DESCRIPTION OF EMBODIMENTS

A specific embodiment according to the present disclosure will be described with reference to the drawings. In the following description, an example in which a power supply control apparatus according to the present disclosure is applied to a semiconductor failure detection apparatus mounted on a vehicle will be described, but the present disclosure is not limited to this example, and can be applied to various power supply control apparatuses each having a switching function such as a DC/DC converter.

<Configuration of Semiconductor Failure Detection Apparatus>

Figure 1:
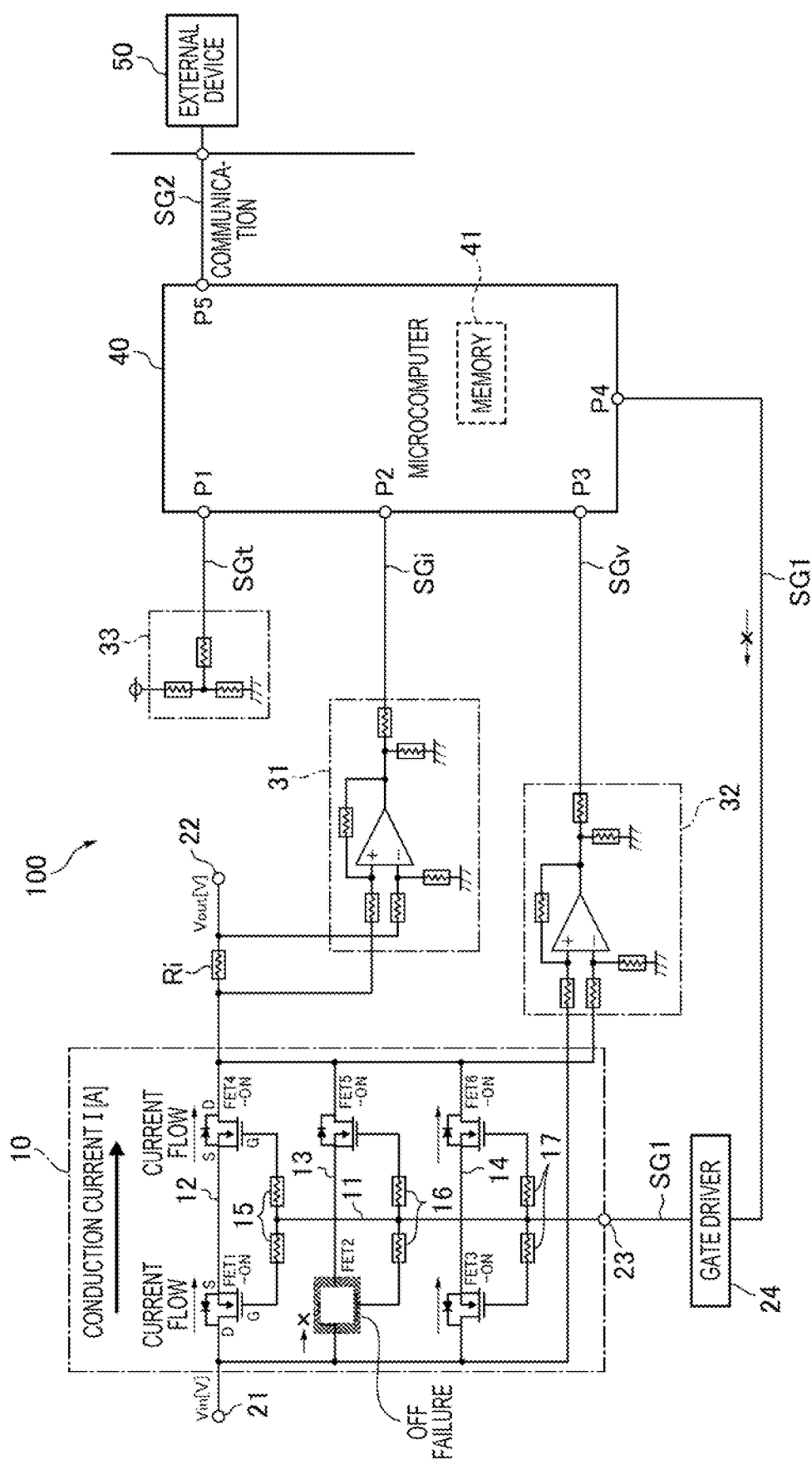
FIG. 1 is an electric circuit diagram showing a configuration example of a semiconductor failure detection apparatus according to an embodiment of the present disclosure.

FIG. 1 shows a configuration example of a semiconductor failure detection apparatus 100 (power supply control apparatus) according to the embodiment of the present disclosure.

The semiconductor failure detection apparatus 100 shown in FIG. 1 has a function of detecting a failure of a semiconductor switch element incorporated in a switching circuit 10. The switching, circuit 10 is mounted on a vehicle, and is used to supply power-supply electric power from an in-vehicle power supply to in-vehicle devices (various electrical components) as loads.

An input terminal 21 of the semiconductor failure detection apparatus 100 is connected to an output of the in-vehicle power supply. An output terminal 22 is connected to at power supply input terminal of an in-vehicle device (not shown), Since the switching circuit 10 is used in a vehicle, there is a possibility that power-supply electric power with a reverse polarity due to erroneous connection of a power supply is input or an excessive power supply voltage is input. The switching circuit 10 is designed so that a failure does not occur even in the case of such erroneous connection. In addition, in order to improve reliability, a redundancy function is included in the switching circuit 10.

Specifically, six semiconductor switch elements FET1 to FET6 are included in the switching circuit 10. Each of the semiconductor switch elements FET1 to FET6 is an MOS field effect transistor (FET) device. Note that "FET1-ON" to "FET6-ON" shown in FIG. 1 mean that each of the semiconductor switch elements FET1 to FET6 is in an ON (conductive) state.

In the switching circuit 10 shown in FIG. 1, the semiconductor switch elements FET1, FET4 are connected in series with reverse polarities to each other. That is, a drain terminal (D) of the semiconductor switch element FET1 is connected to the input terminal 21, a source terminal (S) of the semiconductor switch element. FET1 and a source terminal of the semiconductor switch element FET4 are connected to each other via a conduction path 12, and a drain terminal of the semiconductor switch element FET4 is connected to an output terminal 22 side. That is, the two semiconductor switch elements FET1, FETA form one series circuit.

In the same manner as above, the two semiconductor switch elements FET2, FET5 form one series circuit. Further, the two semiconductor switch elements FET3, FET6 form one series circuit.

The series circuit of the semiconductor switch elements FET1, FET4, the series circuit of the semiconductor switch elements FET2, FET5, and the series circuit of the semiconductor switch elements FET3, FET6 are connected in parallel to one another.

Gate terminals (G) of the semiconductor switch elements FET1, FET4 are connected to a common control line 11 via resistors 15, gate terminals of the semiconductor switch elements FET2, FET5 are connected to the common control line 11 via resistors 16, and gate terminals of the semiconductor switch elements FET3, FET6 are connected to the common control line 11 via resistors 17.

Therefore, by controlling a control signal SG1 applied to the common control line 11, the semiconductor switch elements FET1 to FET6 can be simultaneously turned on and off. When the series circuit of the semiconductor switch elements FET1, FET4 is turned on, a conduction path is formed, so that a current flows from the input terminal 21 to the output terminal 22 side through the semiconductor switch element FET1, the conduction path 12, and the semiconductor switch element FET4. When the series circuit is turned off, DO current flows through the above conduction path.

In the same manner as above, when the series circuit of the semiconductor switch elements FET2, FET5 is turned on, a conduction path is formed, so that a current flows from the input terminal 21 to the output terminal 22 side through the semiconductor switch element FET2, a conduction path 13, and the semiconductor switch element FET5. When the series circuit is turned off, no current flows through the above conduction path.

In the same manner as above, when the series circuit of the semiconductor switch elements FET3. FET6 is turned on, a conduction path is formed, so that: a current flows from the input terminal 21 to the output terminal 22 side through the semiconductor switch element FET3, a conduction path 14, and the semiconductor switch element FET6. When the series circuit is turned off, no current: flows through the above conduction path.

Since control inputs of the three series circuits are all connected to the common control line 11, the three series circuits are normally switched to the same ON/OFF state at the same time in accordance with the control signal SG1.

Therefore, a conduction current I flowing from the input terminal 21 to the output terminal 22 side through the switching circuit 10 is divided inside the switching circuit 10, the divided currents respectively flow through the three series circuits, merge on a downstream side, and the merged current passes through a path leading to the output terminal 22.

Incidentally, there is a possibility that a failure may occur in any one of the semiconductor switch elements FET1 to FET6 in the switching circuit 10. An "OFF failure" of the semiconductor switch element FET2 shown in FIG. 1 means a state in which the semiconductor switch element FET2 is fixed to the OFF state due to a failure and the failure in which the semiconductor switch element FET2 is not switched to the ON state occurs. As shown in FIG. 1, in the case in which the semiconductor switch element FET2 is in an "OFF failure" state, when the control signal SG1 is switched to ON, a failure state occurs in which currents flow through the conduction paths 12, 14 but a current does not flow through the conduction path 13. However, even in this failure state, since the conduction current I flows through the conduction paths 12, 14, a function of a load connected to the output terminal 22 can be maintained normally.

However, since the current does not flow through the conduction path 13, currents more than usual flow more intensively through the semiconductor switch elements FET1, FET3, FET4, FET6 of the paths 12, 14 other than the conduction path 13, As a result, a stress due to an influence of an excessive current and heat is applied to the semiconductor switch elements FET1, FET3, FET4, and a failure is more likely to occur than usual.

Therefore, before the semiconductor switch elements FET1, FET3, FET4, FET6 that have not tailed yet are failed and a function of the switching circuit 10 is completely stopped, it is necessary to detect that a failure occurs inside the switching circuit 10.

However, in the switching circuit 10 shown in FIG. 1, a pair of semiconductor switch elements are connected in series with reverse polarities and three series circuits are connected in parallel, and thus, an occurrence of a failure cannot be detected by a general method. For example, in a case in which only one series circuit is provided, it is possible to easily identify whether the switching circuit is normal only by comparing high/low of a voltage of the conduction path 13 with high/low of a voltage of the control signal SG1. However, since the three series circuits are connected in parallel, the voltage of the conduction path 13 is not much different from that in a case in which no failure occurs, and a failure cannot be detected.

Therefore, in the semiconductor failure detection apparatus 100 shown in FIG. 1, a microcomputer 40 detects the "OFF failure" of the semiconductor switch element FET2 or the like by performing a special process described later.

As shown in FIG. 1, a resistor Ri for current detection is connected between an output of the switching circuit 10 and the output terminal 22. The resistor Ri has a very small resistance value to an extent that the resistor Ri hardly affects the conduction current I. In addition, a voltage drop represented by a product of the resistance value and the conduction current I occurs between terminals of the resistor Ri.

Meanwhile, two inputs of a current detection circuit 31 are connected to the two terminals of the resistor Ri, respectively. Therefore, the current detection circuit 31 cam output a voltage obtained by amplifying a potential difference between the terminals of the resistor Ri as a current signal SGi. That is, information represented by the voltage of the current signal SGi corresponds to the conduction current I.

Two inputs of a potential difference detection circuit 32 are connected to an input side of the switching circuit 10 and an output side of the switching circuit 10, respectively. Therefore, the potential difference detection circuit 32 can amplify a signal representing a potential difference between an input and an output of the switching circuit 10 and output the amplified signal as a voltage signal SGv.

Meanwhile, a temperature detection circuit 33 includes a temperature sensor that detects a temperature in the vicinity of the switching circuit 10. For example, it is possible to detect the temperature in the vicinity of the switching circuit 10 by installing the temperature sensor of the temperature detection circuit 33 on a heat sink that promotes heat dissipation of the semiconductor switch elements FET1 to FET6, or the like. As the temperature sensor, for example, a thermistor can be used. The temperature detection circuit 33 outputs a temperature signal SGt indicating the temperature in the vicinity of the switching circuit 10.

The microcomputer 40 includes analog input ports P1, P2, P3, an output port P4, and a communication port P5, The analog input port. Pt of the microcomputer 40 is connected to an output of the temperature detection circuit 33, The analog input port P2 of the microcomputer 40 is connected to an output of the current: detection circuit 31, and the analog input port P3 is connected to an output of the potential difference detection circuit 32, The output port P4 of the microcomputer 40 is connected to an input of a gate driver 24. The communication port P5 is connected to an external device 50 via a communication line.

The microcomputer 40 stores in advance a control program necessary for implementing the function of the semiconductor failure detection apparatus 100. A nonvolatile memory 41 is incorporated in the microcomputer 40. The nonvolatile memory 41 stores constant data required for failure detection in advance.

The microcomputer 40 can sequentially sample analog levels (voltages) of the signals respectively input to the analog input ports P1 to P3 and convert the analog levels into digital signals. Therefore, the microcomputer 40 can acquire temperature information corresponding to the analog level of the temperature signal SGt, the information of the conduction current I corresponding to the analog level of the current signal SGi, and information of the potential difference corresponding to the analog level of the voltage signal SGV.

The microcomputer 40 can output the control signal SG1, which is a binary from the output port P4. The control signal SG t is supplied to a control input terminal 23 of the switching circuit 10 via the gate driver 24. Therefore, the microcomputer 40 can switch ON (conductive)/OFF (nonconductive) of the switching circuit 10 by switching ON/OFF of the control signal SG1.

The microcomputer 40 can communicate with the external device 50 using the communication port P5 to input and output various kinds of information. For example, when a failure of a device occurs inside the switching circuit 10, information indicating the failure can be notified to the external device 50.

<Failure Determination Process>

Figure 2:
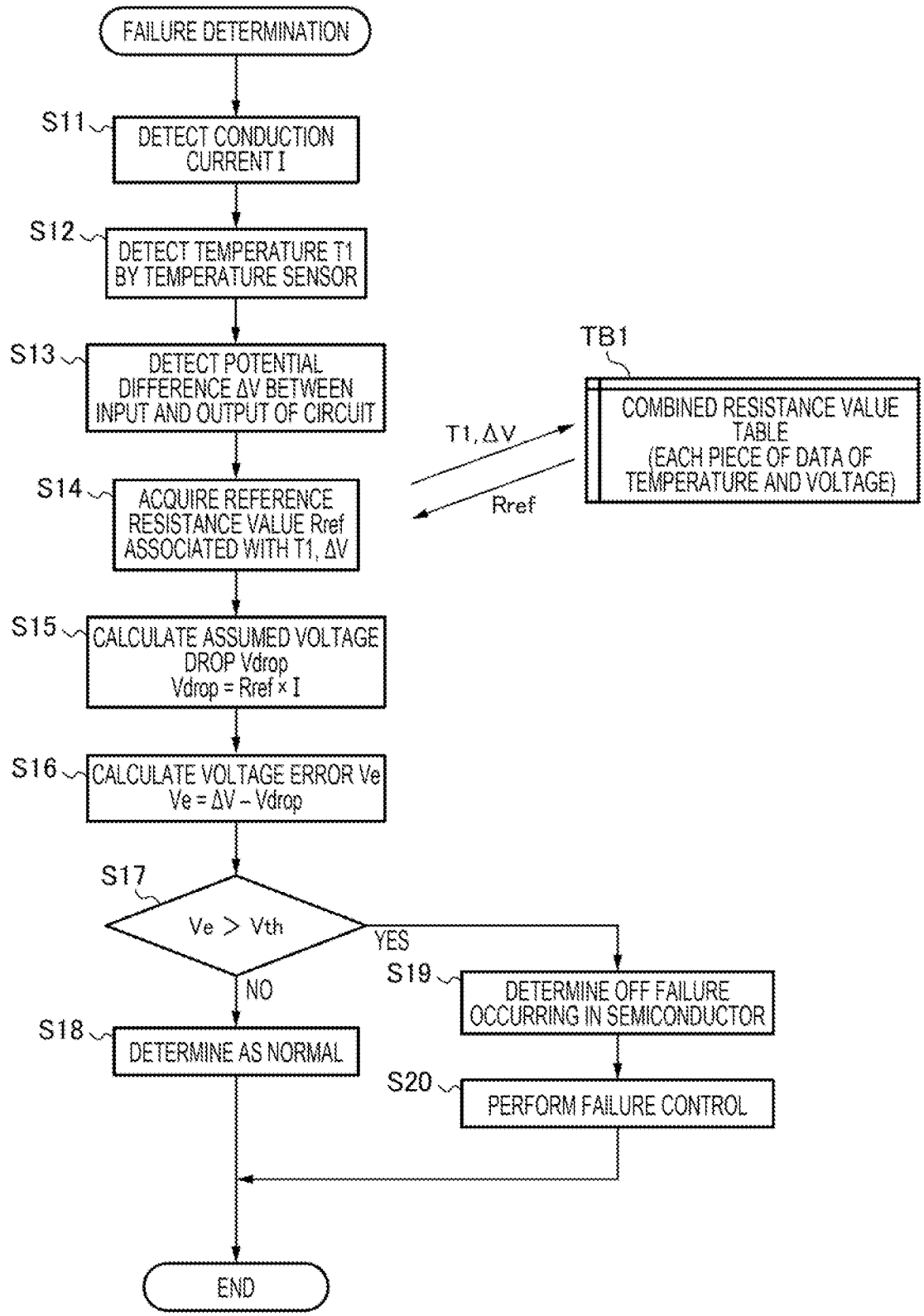
FIG. 2 is a flowchart showing an example of a failure determination process according to the embodiment of the present disclosure.

An example of a failure determination process according to the embodiment of the present disclosure is shown in FIG. 2, That is, when the microcomputer 40 shown in FIG. 1 executes a program of the failure determination process shown in FIG. 2, it is possible to detect the "OFF failure" in each of the semiconductor switch elements FET1 to FET6 of the switching circuit 10, The process shown in FIG. 2 is periodically and repeatedly executed. The failure determination process of FIG. 2 will be described below.

The microcomputer 40 samples the current signal SG acquire information of the latest conduction current I (S11).

The microcomputer 40 samples the temperature signal SGt to acquire information of a latest temperature T1 (S12).

The microcomputer 40 samples the voltage signal Slurs to acquire information of a latest potential difference ΔV (S13). The potential difference ΔV is a difference between a voltage VIN [V] on the input side of the switching circuit 10 and a voltage Vout [V] on the output side.

Meanwhile, the nonvolatile memory 41 in the microcomputer 40 includes a combined resistance value table TB1 shown in FIG. 2. Each piece of data stored in the combined resistance value table TB1 represents a reference value (reference resistance value Rref) of a combined resistance value in the entire circuit between the input side (input terminal 21) and the output side of the switching circuit 10 in the ON state in which all of the semiconductor switch elements FET1 to FET6 are conductive. These pieces of data correspond to, for example, values obtained by actual measurement in a standard state in which all of the semiconductor switch elements FET1 to FET6 function normally, or values equivalent thereto. The combined resistance value corresponding to each of various changes in the temperature T1 in the switching circuit 10 and the combined resistance value corresponding to each of various changes in the potential difference ΔV are determined in advance and registered in the combined resistance value table TB1.

The microcomputer 40 gives information on the temperature T1 acquired in S12 and the potential difference ΔV acquired in S13 to the combined resistance value table TB1, and acquires the appropriate reference resistance value Rref associated with T11 and ΔV (S14).

The microcomputer 40 calculates, as an assumed voltage drop Vdrop, an assumed potential difference between input and output terminals of the switching circuit 10 when the semiconductor switch elements FET1 to FET6 in the switching circuit 10 normally function (all are in the conductive state) (S15). The assumed voltage drop Vdrop is calculated by the following equation.

$$Vdrop = Rref \times I \quad (1)$$

The microcomputer 40 calculates a voltage error Ve by the following equation (S16), and compares the voltage error Ve with a voltage threshold Vth (S17), As for the voltage threshold Vth, a constant, which is determined in advance, is registered in the nonvolatile memory 41 and used.

$$Ve = \Delta V - Vdrop \quad (2)$$

The microcomputer 40 proceeds from S17 to S18 in a case of "Ve≤Vth", and proceeds from S17 to S19 in a case of "Ve>Vth".

That is, when the potential difference ΔV actually detected in S13 is equal to the assumed voltage drop Vdrop calculated based on the reference resistance value Rref (Ve≤Vth), the combined resistance value between the input and output of the switching circuit 10 is equal to that in the standard state. Therefore, in this case, the microcomputer 40 identifies that all of the semiconductor switch elements FET1 to FET6 are normal (S18).

When the potential difference ΔV actually detected in S13 is too large as compared with the assumed voltage drop Vdrop (Ve>Vth), the microcomputer 40 identifies that the "OFF failure" occurs in any of the semiconductor switch elements FET1 to FET6 (S19). In this case, the microcomputer 40 thither performs predetermined lure control in order to facilitate handling of the failure (S20).

As the specific failure control, the microcomputer 40 controls the control signal SG1 to cut off the conduction of the switching circuit 10 as shown in FIG. 1, or to switch from on/off control to pulse width modulation (PWM) control or the like, thereby preventing the conduction current I of the switching circuit 10. In addition, the microcomputer 40 notifies the external device 50 that a failure occurs in the switching circuit 10 by communication of a communication signal SG2.

Even when there is a failure inside the switching circuit 10, the switching circuit 10 itself still functions: normally due to the redundant function. However, for example, when the semiconductor switch element FET2 is left as it is in the "OFF failure" state, an extra stress applied to the remaining normal semiconductor switch elements FET1, FET3, FET4, FET6. In either case, there is a high possibility that the function of the switching circuit 10 is completely stopped.

Therefore, the conduction of the switching circuit 10 is cut off by the failure control, or the conduction current I is prevented by the PWM control or the like. By this control, it is possible to reduce the stress applied to the remaining normal semiconductor switch elements and to extend a time before the function of the switching circuit 10 is stopped. In addition, by notifying the external device 50 or the like of the occurrence of the failure by the failure control, it is possible to prompt a user or the like of the vehicle to repair the failure of the switching circuit 10 early and secure safety.

<Detection of Occurrence of on Failure>

Figure 3:
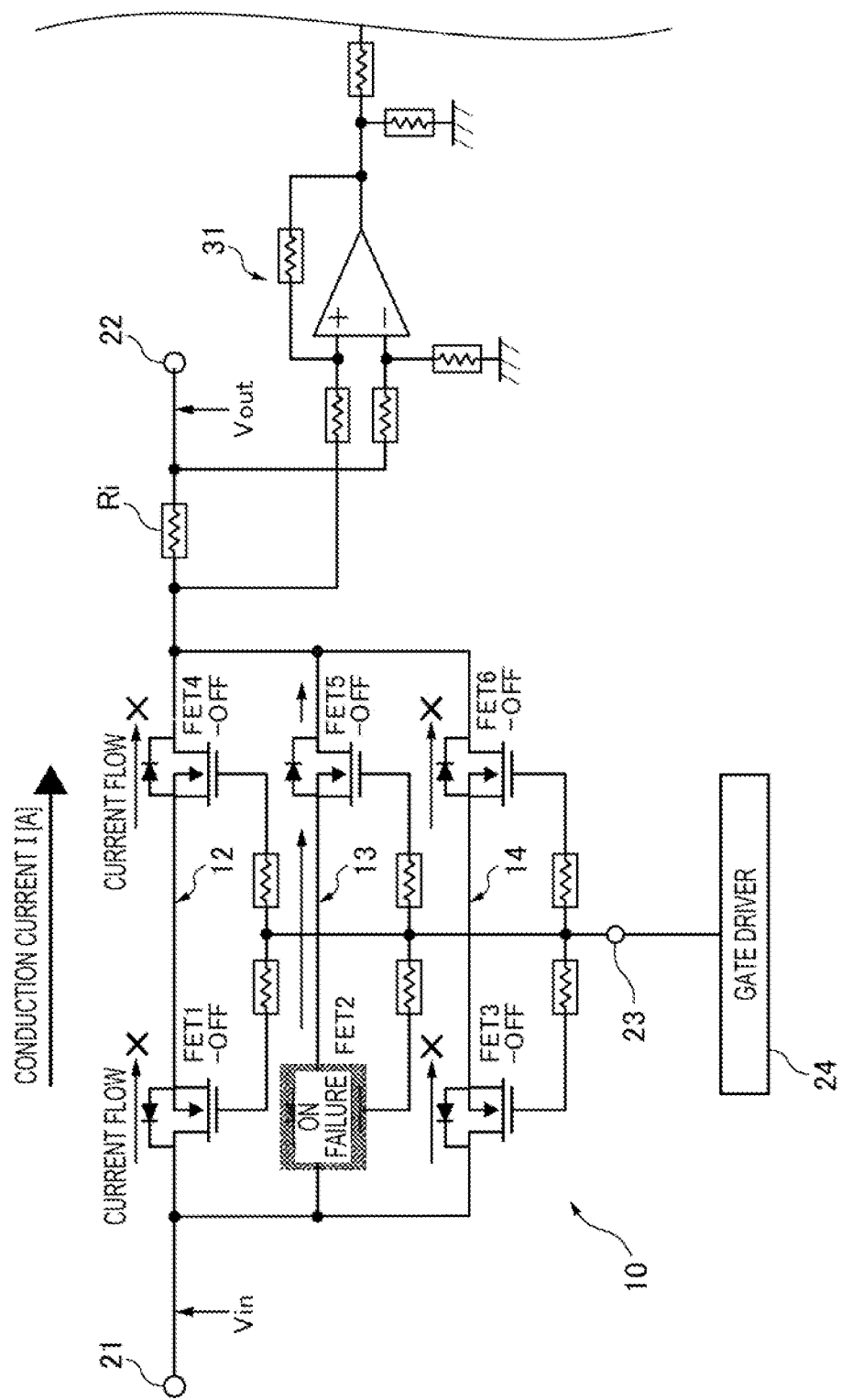
FIG. 3 is an electric circuit diagram showing an example of a switching circuit w an ON failure occurs.

An example of the switching circuit 10 when an ON failure occurs is shown in FIG. 3. In the example shown in FIG. 3, it is assumed that the "ON failure" occurs in the semiconductor switch element FET2, and the semiconductor switch elements FET1, FET3, FET4, FET5, FET6 other than the semiconductor switch element FET2 are M a normal state. The "ON failure" means a state in which switching to OFF is not performed in a usual conduction state.

When the control signal SG1 applied to the common control input terminal 23 becomes OFF, originally, all the semiconductor switch elements FET1 to FET6 are turned off, and thus the entire circuit should be cut off and the conduction current I should be 0. However, in the example of FIG. 3, since the "ON failure" occurs in the semiconductor switch element FET2, even when the control signal SG1 is OFF, the conduction current I flows due to the current passing through the conduction path 13.

Therefore, it is possible to easily detect the "ON failure" as in the example shown in FIG. 3. For example, the microcomputer 40 monitors voltages of the respective conduction paths 12 to 14, and only by comparing high/low of the voltages with the ON/OFF of the control signal SG01, whether the switching circuit is normal is identified. That is, in the example of FIG. 3, the voltages of the conduction paths 12, 13, 14 become "low", "high", "low", respectively, in the state in which the control signal SG1 is OFF, and thus it is possible to recognize that the "ON failure" occurs in the semiconductor switch element FET2, <Modification of Semiconductor Failure Detection Apparatus>

In the failure determination process shown in FIG. 2, it is assumed that the combined resistance value table TRI stores, in advance, a large number of corrected reference resistance values Rref in consideration of an influence of each of the actual temperature T1 and the potential difference ΔV, and the correction may be performed by calculation. For example, it is possible to appropriately correct one reference resistance value Rref in accordance with a characteristic of the combined resistance value in the actual switching circuit 10 by using a temperature correction value obtained by a predetermined function using the temperature T1 as a variable and a potential difference correction value obtained by another function using the potential difference ΔV as a variable, <Advantages of Semiconductor Failure Detection Apparatus>

In the semiconductor failure detection apparatus 100 shown in FIG. 1, it is possible to easily identify a presence or absence of a semiconductor switch element in which the "OFF failure" occurs in the switching circuit 10, In the switching circuit 10, a plurality of series circuits are connected in parallel, and each has a plurality of semiconductor switch elements connected with reverse polarities. In the example of FIG. 1, it is identified that the "OFF failure" occurs in the FET 2.

In addition, when the failure determination shown in FIG. 2 is performed, the assumed voltage drop Vdrop is calculated using the reference resistance value Rref corrected according to the actual temperature T1 and the potential difference ΔV, and thus it is easy to improve accuracy of the failure determination.

Further, when the "OFF failure" of the semiconductor switch element is detected, the failure control is performed in S20, so that an excessive stress applied to the normal semiconductor switch elements can be reduced, and further progress of the failure of the switching circuit 10 can be prevented. In addition, it is possible to prompt a user to repair the failure early and secure safety.

<Supplementary Explanation>

Here, characteristics of the embodiment of the power sill ply control apparatus and a semiconductor failure detection method according to the present disclosure described above are summarized briefly in the following [1] to [5].

A power supply control apparatus (semiconductor failure detection apparatus 100) for detecting a failure of a semiconductor switch element in a switching circuit (10), the switching circuit (10) including a plurality of semiconductor series circuits which are connected in parallel to one another, and each of the semiconductor series circuits having a plurality of semiconductor switch elements (FET1 to FET6) which are connected in series with reverse polarities, the power supply control apparatus (semiconductor failure detection apparatus 100) including:

a reference resistance value storing unit that stores in advance information (combined resistance value table TB1) on a combined resistance value between an input and an output of the switching circuit in a reference state as a reference resistance value (Rref);

a conduction current detection unit (microcomputer 40, S11) configured to detect a magnitude of a current flowing through the entire switching circuit as a conduction current (I);

a potential difference detection unit (microcomputer 40, S13) configured to detect a potential difference between the input and the output of the switching circuit as an input-output potential difference;

a voltage drop calculation unit (microcomputer 40, S12) figured to calculate art assumed voltage drop (Vdrop) based on the reference resistance value and the conduction current detected by the conduction current detection unit;

a voltage comparison unit (microcomputer 40, S16, S17) configured to compare the input-output potential difference detected by the potential difference detection unit with the assumed voltage drop calculated by the voltage drop calculation unit; and a failure identification unit (microcomputer 40, S18, S19) configured to identify a presence or absence of a failure of the semiconductor switch element based on a comparison result of the voltage comparison unit.

According to the power supply control apparatus having the configuration of above [1], the reference resistance value can be acquired from the reference resistance value storing unit as known information. Therefore, the voltage drop calculation unit can calculate the assumed voltage drop expected to occur between the input and the output of the switching circuit in the reference state, that is, in a normal state, based on the reference resistance value and the detected conduction current. In addition, when there is a large difference in a result of comparison, performed by the voltage comparison unit, between the input-output potential difference detected by the potential difference detection unit by actual measurement and the assumed voltage drop obtained by calculation, since the difference in the result is different from that in the reference state, it can be considered that an abnormality occurs in one Or more semiconductor switch elements. Therefore, the failure identification unit can identify the presence or absence of a failure of the semiconductor switch element based on the comparison result of the voltage comparison unit.

[2] The power supply control apparatus according to above [1] further including:

a temperature detection unit (temperature detection circuit 33) configured to detect a temperature (T1) in the vicinity of the switching circuit; and a temperature correction unit (microcomputer 40, S14) configured to correct the reference resistance value based on the temperature detected by the temperature detection unit.

According to the power supply control apparatus having the configuration of above [2], since failure detection can be performed after an influence of a temperature change is corrected, the failure detection can be performed with higher accuracy, That is, since a resistance value between input and output terminals of the semiconductor switch element varies due to an influence of an environmental temperature, a difference according to the temperature change is generated between the reference resistance value of the semiconductor switch element specified in the reference state and the actual resistance value. By correcting an influence of this difference, accurate failure detection can be performed, [3] The power supply control apparatus according to [1] or [2], further including: a voltage correction unit (microcomputer 40, S14) configured to correct the reference resistance value based on the input-output potential difference ($\Delta V$) detected by the potential difference detection unit.

According to the power supply control apparatus having the configuration of above [3], since the failure detection can be performed after an influence of a change in the input-output potential difference is corrected, the failure detection can be performed with higher accuracy. That is, since the resistance value between input and output terminals of the semiconductor switch element varies according to the potential difference between the input and output terminals, a difference according to a difference in potential difference is generated between the reference resistance value of the semiconductor switch element specified in the reference state and the actual resistance value. By correcting an influence of this difference, accurate failure detection can be performed.

[4] The power supply control apparatus according to any one of [1] to [3], in which in a case that the failure identification unit detects the presence of the failure in the semiconductor switch element, the failure identification unit performs failure control (20) including at least one of abnormality detection notification to a predetermined external device and operation prevention of the switching circuit.

According to the power supply control apparatus having the configuration of the above [4], when a failure occurs in the semiconductor switch element, the abnormality detection notification is performed by the failure control, and thus A is possible to attract: the user's attention to repair the failure before a more serious failure occurs. In addition, since operations of the switching circuit are prevented by the failure control, it is possible to reduce a stress caused by an excessive current and heat applied to the remaining semiconductor switch elements that have not failed yet, and to increase a margin of time before the entire apparatus completely fails. [5] A semiconductor failure detection method for detecting a failure of a semiconductor switch element in a switching circuit (10), the switching circuit (10) including a plurality of semiconductor series circuits which are connected in parallel to one another, and ach of the semiconductor series circuits having a plurality of semiconductor switch elements (FET1 to FET6) which are connected in series with reverse polarities, the semiconductor failure detection method including:

obtaining in advance a combined resistance value (combined resistance value table TB1) between an input and an output of the switching circuit in a reference state as a reference resistance value (Rref);

detecting a magnitude of a current flowing through an entire of the switching circuit as a conduction current (I) (S11);

detecting a potential difference between the input and the output of the switching circuit as an input-output potential difference ($\Delta V$) (S13);

calculating an assumed voltage drop Vdrop) based on the reference resistance value and the detected conduction current (S15): and identifying a presence or absence of a failure of the semiconductor switch element based on a comparison result between the detected input-output potential difference and the assumed voltage drop (S16 to S19).

[6] The semiconductor failure detection method according to [5], further including: detecting a temperature in a vicinity of the switching circuit; and correcting the reference resistance value based on the detected temperature. [7] The semiconductor failure detection method according to [5] or [6], further including:

correcting the reference resistance value based on the detected input-output potential difference ($\Delta V$).

[8] The semiconductor failure detection method according to any one of [5] or [7], further including:

in a case that the presence of the failure in the semiconductor switch element is detected, performing a failure control (20) including at least one of abnormality detection notification to a predetermined external device and operation prevention of the switching circuit.

According to the semiconductor failure detection method of the procedure of above [5], since the reference resistance value is obtained in advance, the reference resistance value can be handled as known information. Therefore, the assumed voltage drop expected to occur between the input and the output of the switching circuit in the reference state, that is, in a normal state, can be calculated based on the reference resistance value and the detected conduction current. In addition, when there is a large difference in a result of comparison between the input-output potential difference detected by actual measurement and the assumed voltage drop obtained by calculation, since the difference in the result is different from that in the reference state, it can be considered that an abnormality occurs in one or more semiconductor switch elements.

What is claimed is:

1. A power supply control apparatus for detecting a failure of a semiconductor switch element in a switching circuit, the switching circuit including a plurality of semiconductor series circuits which are connected in parallel to one another, and each of the semiconductor series circuits having a plurality of semiconductor switch elements which are connected in series with reverse polarities, the power supply control apparatus comprising:

a memory that stores in advance information on a combined resistance value between an input and an output of the switching circuit in a reference state as a reference resistance value of a combined resistance value in the entire circuit between an input side and an output side of the switching circuit in an ON state in which all of the semiconductor switch elements are conductive; and a microcomputer configured to implement:
  detecting a magnitude of a current flowing through an entire of the switching circuit as a conduction current;
  detecting a potential difference between the input and the output of the switching circuit as an input-output potential difference;
  calculating an assumed voltage drop based on the reference resistance value and the conduction current;
  comparing the input-output potential difference with the assumed voltage drop; and
  identifying a presence or absence of a failure of the semiconductor switch element based on a comparison result.

2. The power supply control apparatus according to claim 1, wherein the microcomputer is further configured to implement:
  detecting a temperature in a vicinity of the switching circuit; and
  correcting the reference resistance value based on the temperature.

3. The power supply control apparatus according to claim 1, wherein the microcomputer is further configured to implement:
  correcting the reference resistance value based on the input-output potential difference.

4. The power supply control apparatus according to claim 1,
  wherein in a case that the microcomputer detects the presence of the failure in the semiconductor switch element, the microcomputer performs a failure control including at least one of abnormality detection notification to a predetermined external device and operation prevention of the switching circuit.

5. The power supply control apparatus according to claim 1,
  wherein the plurality of semiconductor series circuits of the switching circuit comprise a first semiconductor series circuit and a second semiconductor series circuit,
  wherein the first semiconductor series circuit comprises a first pair of the plurality of semiconductor switch elements, the first pair of the plurality of semiconductor switch elements being connecting in series with reverse polarities to each other,
  wherein the second semiconductor series circuit comprises a second pair of the plurality of semiconductor switch elements, the second pair of the plurality of semiconductor switch elements being connecting in series with reverse polarities to each other and being different ones of the plurality of semiconductor switch elements than the first pair of the plurality of semiconductor switch elements,
  wherein the first pair of the plurality of semiconductor switch elements is collectively connected in parallel to the second pair of the plurality of semiconductor switch elements.

6. The power supply control apparatus according to claim 5, wherein the combined resistance value, between an input and an output of the switching circuit, comprises a combined resistance of at least resistances of the first pair of the semiconductor switch elements and the second pair of semiconductor switch elements.

7. A semiconductor failure detection method for detecting a failure of a semiconductor switch element in a switching circuit, the switching circuit including a plurality of semiconductor series circuits which are connected in parallel to one another, and each of the semiconductor series circuits having a plurality of semiconductor switch elements which are connected in series with reverse polarities, the semiconductor failure detection method comprising:
  obtaining in advance a combined resistance value between an input and an output of the switching circuit in a reference state as a reference resistance value of a combined resistance value in the entire circuit between an input side and an output side of the switching circuit in an ON state in which all of the semiconductor switch elements are conductive;
  detecting a magnitude of a current flowing through an entire of the switching circuit as a conduction current;
  detecting a potential difference between the input and the output of the switching circuit as an input-output potential difference;
  calculating an assumed voltage drop based on the reference resistance value and the detected conduction current; and
  identifying a presence or absence of a failure of the semiconductor switch element based on a comparison result between the detected input-output potential difference and the assumed voltage drop.

8. The semiconductor failure detection method according to claim 7, further comprising:
  detecting a temperature in a vicinity of the switching circuit; and
  correcting the reference resistance value based on the detected temperature.

9. The semiconductor failure detection method according to claim 7, further comprising:
  correcting the reference resistance value based on the detected input-output potential difference.

10. The semiconductor failure detection method according to claim 7, further comprising:
  in a case that the presence of the failure in the semiconductor switch element is detected, performing a failure control including at least one of abnormality detection notification to a predetermined external device and operation prevention of the switching circuit.

* * * * *